(12) United States Patent
Black et al.

(10) Patent No.: US 8,653,467 B2
(45) Date of Patent: Feb. 18, 2014

(54) MULTICHIP PACKAGING FOR IMAGING SYSTEM

(75) Inventors: Stephen H. Black, Buellton, CA (US); Michael A. Gritz, Santa Barbara, CA (US); Adam M. Kennedy, Santa Barbara, CA (US)

(73) Assignee: Raytheon Company, Waltham, MA (US)

( * ) Notice: Subject to any disclaimer, the term of this patent is extended or adjusted under 35 U.S.C. 154(b) by 12 days.

(21) Appl. No.: 13/526,919

(22) Filed: Jun. 19, 2012

(65) Prior Publication Data

US 2013/0334425 A1   Dec. 19, 2013

(51) Int. Cl.
*G01T 1/24* (2006.01)
(52) U.S. Cl.
USPC ............ 250/370.08; 250/332; 250/338.4
(58) Field of Classification Search
USPC ........ 250/330, 332, 336.1, 338.1, 338.4, 340, 250/341.1, 349, 370.01, 370.08
See application file for complete search history.

(56) References Cited

U.S. PATENT DOCUMENTS

| | | | |
|---|---|---|---|
| 3,890,500 A | 6/1975 | Eichelberger et al. | |
| 7,239,222 B2 | 7/2007 | Nagaishi et al. | |
| 7,518,553 B2 * | 4/2009 | Zhang et al. | 343/700 MS |
| 7,795,859 B1 * | 9/2010 | Lynch et al. | 324/120 |
| 2003/0122079 A1 | 7/2003 | Pobanz et al. | |
| 2005/0003199 A1 | 1/2005 | Takaya et al. | |
| 2005/0212604 A1 | 9/2005 | Cyr et al. | |
| 2010/0231452 A1 * | 9/2010 | Babakhani et al. | 342/368 |
| 2010/0328779 A1 | 12/2010 | Llombart et al. | |
| 2011/0163457 A1 | 7/2011 | Mohan et al. | |
| 2011/0260039 A1 | 10/2011 | Fowler | |
| 2011/0279190 A1 | 11/2011 | Liu et al. | |
| 2012/0105182 A1 * | 5/2012 | Bohn et al. | 335/296 |

FOREIGN PATENT DOCUMENTS

WO   03029772 A2   4/2003

OTHER PUBLICATIONS

International Search Report and Written Opinion dated Nov. 22, 2013 for Application No. PCT/US2013/046231.

* cited by examiner

*Primary Examiner* — Mark R Gaworecki
(74) *Attorney, Agent, or Firm* — Cantor Colburn LLP

(57) ABSTRACT

A receiver chip for use in an imaging system includes a plurality of receiver dies, each of the receiver dies comprising one or more receiver circuits; a die interconnection layer located on top of the plurality of receiver dies; a quarter wave dielectric layer located on top of the die interconnection layer; and a plurality of antennae located on the quarter wave dielectric layer, each of the plurality of antennae corresponding to a respective receiver circuit, wherein the plurality of antennae are connected to the one or more receiver circuits through the quarter wave dielectric layer and the die interconnection layer by respective vias, such that a distance between a topmost layer of the die interconnection layer and the plurality of antennae is determined by a thickness of the quarter wave dielectric layer.

20 Claims, 16 Drawing Sheets

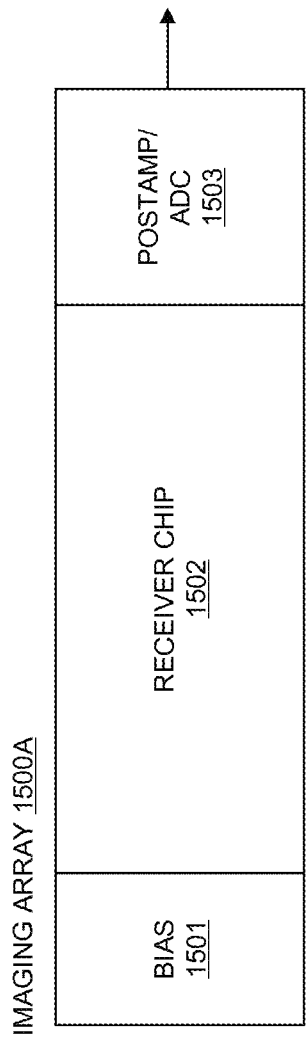
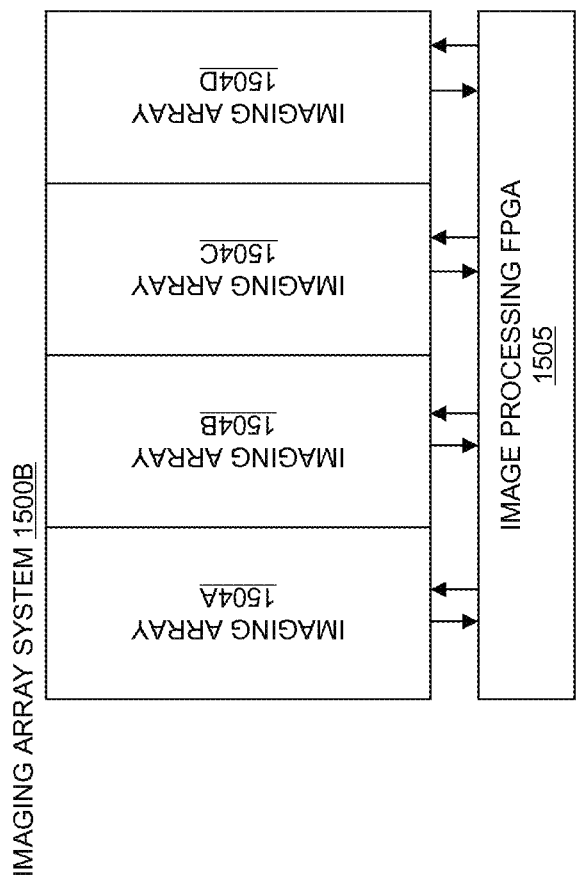

MULTICHIP PACKAGING FOR IMAGING SYSTEM

BACKGROUND

The present disclosure relates generally to an imaging system and, more particularly, to an imaging system implemented using multichip packaging.

Millimeter wave (MMW) imaging systems, hereinafter referred to as imaging systems, are used for many applications, such as aviation, including airport and aircraft safety and all-weather vision, medical and plasma diagnostics, nondestructive testing for voids and delaminations in composite materials, remote sensing of agricultural and environmental conditions, and a wide variety of defense, security, and law enforcement purposes. An imaging system generates an image of an object that is viewed by the imaging system using an array of pixels, each including a respective antenna, that are used in conjunction with sensor optics and various image processing electronics to produce the image. Such imaging systems need to be able to be installed under a wide variety of conditions and in a wide variety of locations, depending on the particular application for which the imaging system is used; size and/or portability issues regarding an imaging system may come into play in some applications.

Each antenna in the imaging system is associated with a respective receiver circuit, with one or more receiver circuits being contained in a semiconductor receiver die. Conventional die level packaging assembly may be used as the packaging technology for the various components that make up an imaging system. In die level assembly packaging, the receiver dies are adhesively or eutectically mounted to a substrate, and electrical interconnections, both between receiver dies and from receiver die to substrate, are formed by wire bonding. Such die level assembly packaging has various limitations when implemented for higher pixel count arrays, as the number of receiver die required grows rapidly. Therefore, even a relatively small 64×64 pixel array requires placing up to 4,096 discrete receiver dies and upwards of 16,384 wire bonds to interconnect the array. The wire bonds require a relatively large amount of space as compared to the receiver dies, increasing the array size. For example, since about 1.5 millimeters (mm) of space must be allowed between the dies for wire bond access, in the case of the 64×64 pixel array, the wire bonds may increase the array size by about 96 mm, which may represent about 75% of the area of the array. This in turn increases the size of the sensor optics needed for use with the array, resulting in a relatively large overall imaging system. Further, each wire bond is a potential failure point, which may affect the reliability of the array in the imaging system. Mounting the individual antennae to their respective receiver dies may also be a relatively complex process.

SUMMARY

In one embodiment, a receiver chip for use in an imaging system includes a plurality of receiver dies, each of the receiver dies comprising one or more receiver circuits; a die interconnection layer located on top of the plurality of receiver dies; a quarter wave dielectric layer located on top of the die interconnection layer; and a plurality of antennae located on the quarter wave dielectric layer, each of the plurality of antennae corresponding to a respective receiver circuit, wherein the plurality of antennae are connected to the one or more receiver circuits through the quarter wave dielectric layer and the die interconnection layer by respective vias, such that a distance between a topmost layer of the die interconnection layer and the plurality of antennae is determined by a thickness of the quarter wave dielectric layer.

In another embodiment, a receiver chip for use in an imaging system includes a plurality of receiver dies, each of the receiver dies comprising one or more receiver circuits; a plurality of baseband logic dies, the plurality of baseband logic dies each comprising one or more support circuits, each support circuit being associated with a respective receiver circuit; and a die interconnection layer located on top of and connected to the plurality of receiver dies and baseband logic dies, the die interconnection layer comprising a plurality of conducting layers comprising ground, interconnect and power planes each separated by a dielectric layer, wherein the plurality of baseband logic dies comprise silicon or silicon germanium, and wherein the plurality of receiver dies comprise gallium arsenide or indium phosphide.

BRIEF DESCRIPTION OF THE DRAWINGS

For a more complete understanding of this disclosure, reference is now made to the following brief description, taken in connection with the accompanying drawings and detailed description, wherein like reference numerals represent like parts:

FIGS. 15A-B are schematic diagrams of exemplary embodiments of multichip packaging for an imaging system.

DETAILED DESCRIPTION

Embodiments of systems and methods for multichip packaging for an imaging system are provided, with exemplary embodiments being discussed below in detail. An imaging system may be assembled from discrete functional building blocks, or receiver chips, each receiver chip comprising an array of pixels, enabling formation of a relatively large format imaging device with relatively small circuitry. Within the receiver chips, semiconductor mass interconnect technology formed using semiconductor fabrication techniques may be used to form the interconnections between the receiver dies that hold the individual pixels, reducing the amount of space needed between receiver dies as compared to receiver die interconnections that are formed by wire bonding. The overall size of the pixel array is therefore reduced, and also the sensor optics needed to us in conjunction with the pixel array in the imaging system. Further, these receiver chips may be connected together into an array having any desired size, allowing configurable formation of imaging systems with larger arrays of pixels. This allows formation of an imaging array that is tailored to the particular application for which the imaging system will be used. Reliability is also increased, as semiconductor interconnects are more reliable than wire bonds. Imaging arrays whose size precludes single receiver die fabrication due to wafer size and yield limitations may also be formed. The semiconductor processing techniques may also be used to form the antennae and antennae matching structure, reducing pixel fabrication complexity. Signal processing and addressing circuitry for use in conjunction with the receiver chips are also provided.

Figure 1:
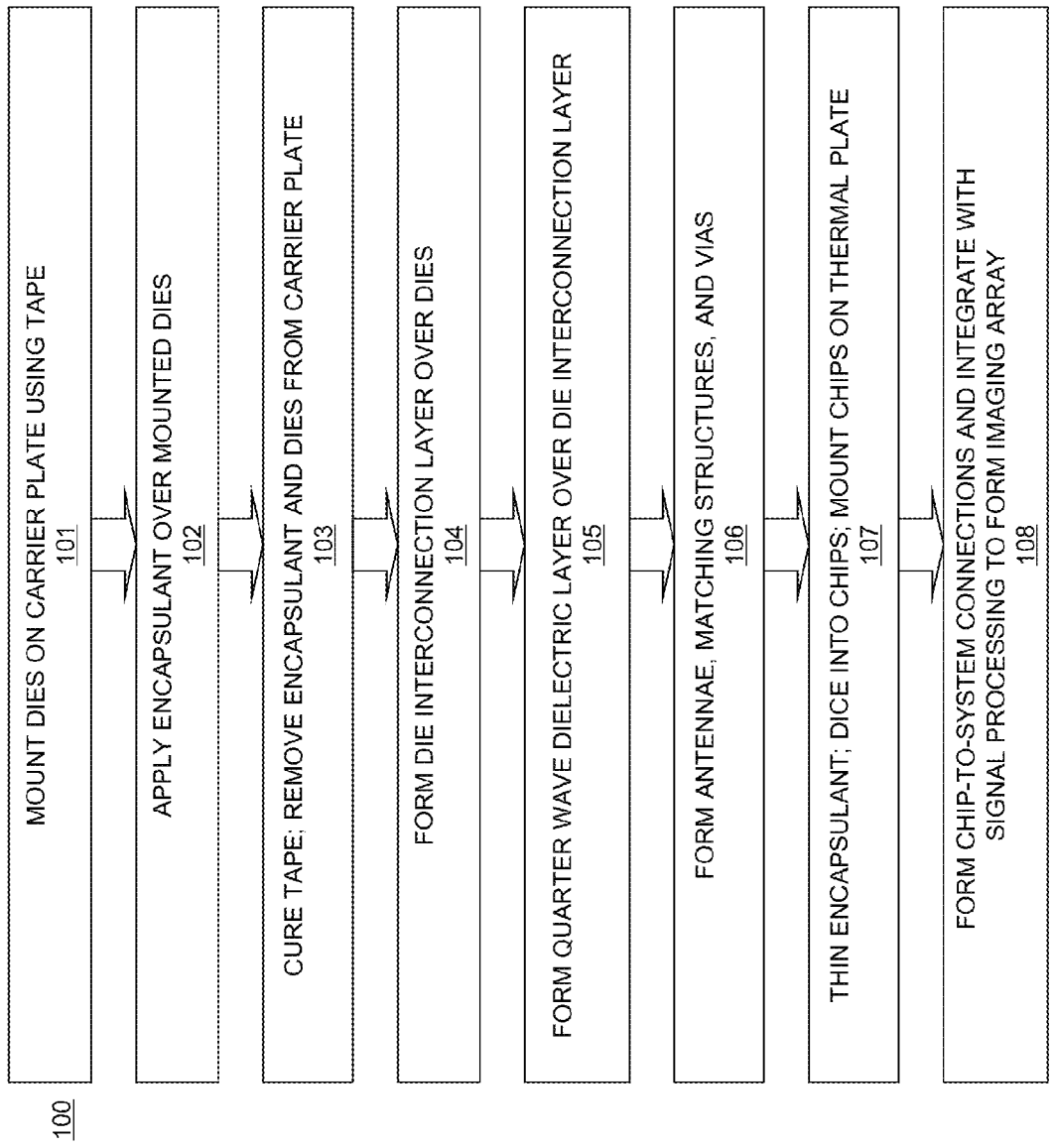
FIG. 1 is a flowchart of an exemplary embodiment of a method for forming a receiver chip for use with systems and methods for multichip packaging for an imaging system.
Figure 2:
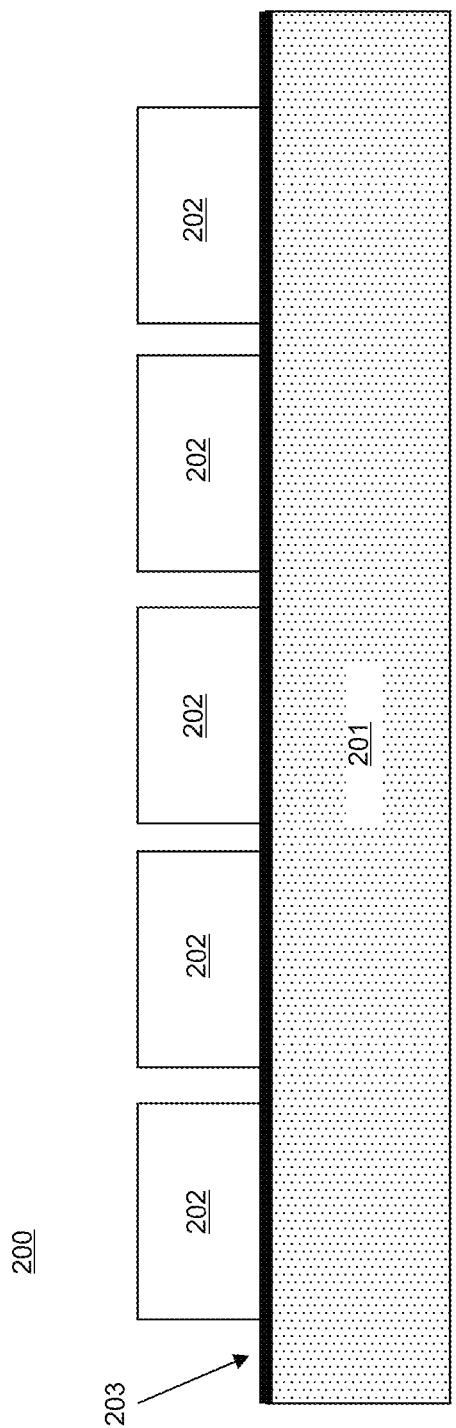
FIGS. 2-10 are cross-sectional schematic block diagrams illustrating an exemplary embodiment of the process flow of the method of FIG. 1.

FIG. 1 illustrates an embodiment of a method 100 of forming a receiver chip for use with systems and methods for multichip packaging for an imaging system. FIG. 1 is discussed with respect to FIGS. 2-10. First, in block 101, a plurality of dies are placed faced down on a carrier plate. The dies may comprise receiver dies comprising any appropriate semiconductor material, including but not limited to silicon, silicon germanium, gallium arsenide, or indium phosphide. The receiver dies may each comprise any appropriate number of receiver circuits (or portions thereof), each receiver circuit corresponding to a pixel. In embodiments in which the receiver dies comprise silicon or silicon germanium, each die may comprise receiver die that includes one or more complete receiver circuits, including associated switching and addressing circuitry. In embodiments in which the receiver dies comprise gallium arsenide or indium phosphide, the one or more receiver circuits on a receiver die may each require an additional respective support circuit, which may be located on a separate baseband logic die. The support circuit may also include switching and addressing circuitry. In such an embodiment, the plurality of dies may comprise a mix of receiver dies and baseband logic dies. Various embodiments of receiver circuits that may be located on the receiver dies and, in some embodiments, the baseband logic dies are discussed in further detail below with respect to FIGS. 11A-B. The dies may be mounted to the carrier plate using an adhesive tape. The carrier plate may be any appropriate flat carrier plate material, including but not limited to, Kovar™ or other suitable materials. The tape may comprise a tape that is cured by application of heat, wherein curing causing the tape to become non-adhesive or to lose some of its adhesion. An example of an appropriate tape is REVALPHA™, which is supplied by Nitto Denko™. Application of block 101 is illustrated in FIG. 2, in which a cross-section of an embodiment of a device 200 including dies 202 mounted on a carrier plate 201 via an adhesive tape 203 is shown. Dies 202 are mounted face-down on the top surface of a carrier plate 201, and the dies 202 are bonded to carrier plate 201 by adhesive tape 203. Dies 202 may include a plurality of receiver dies in some embodiments, or a mixture of receiver dies and baseband logic dies in other embodiments. Dies 202 are shown for illustrative purposes only; any appropriate number of dies 202 corresponding to a receiver chip may be mounted on the carrier plate 201. Also, any appropriate number of additional dies (not shown) corresponding to additional receiver chips may also be mounted on carrier plate 201 and used to fabricate the additional receiver chips by the method 100 of FIG. 1 simultaneously with dies 202. After processing, the additional receiver chips may be separated by dicing, which is discussed below with respect to block 107 of FIG. 1.

Figure 3:
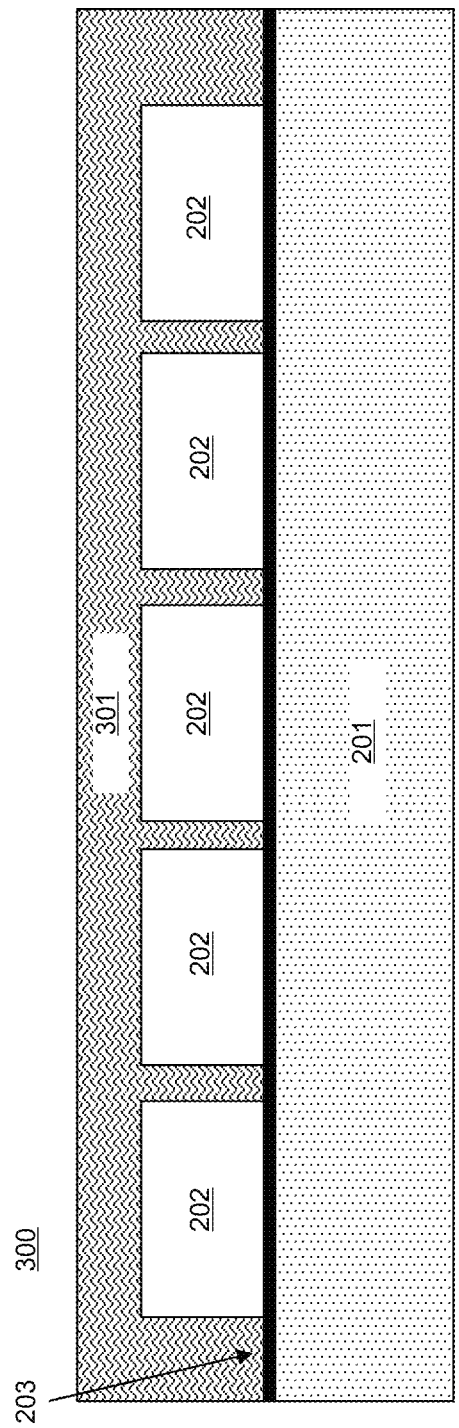
Figure 4:
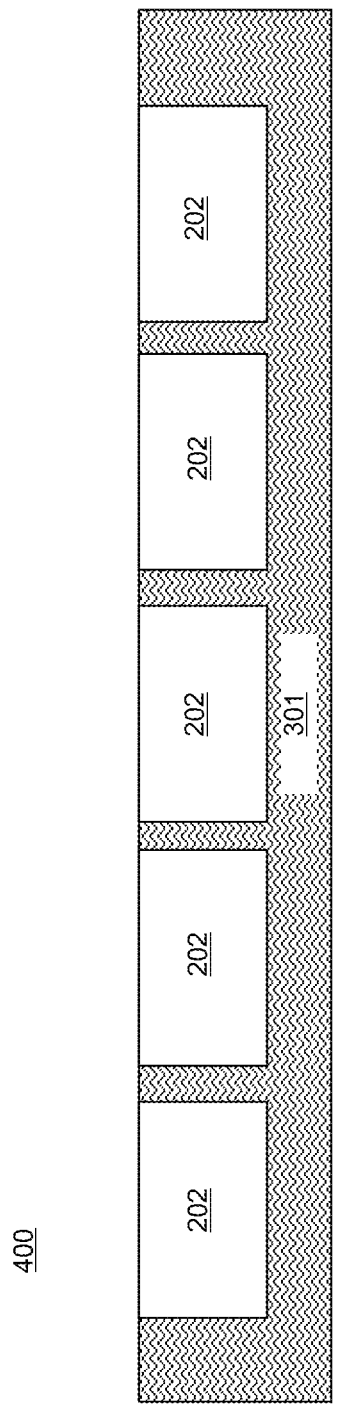

Returning to method 100 of FIG. 1, in block 102, an encapsulant is applied over the mounted dies on the carrier plate. The encapsulant may be any appropriate thermal expansion matched and/or process compatible match molding compound or epoxy, having relatively good flow characteristics, and may be selected such that the encapsulant has thermal properties that are similar to silicon in some embodiments. An example of an appropriate encapsulant is molding compound KMC-211AA-2, which is supplied by ShinEtsu™. FIG. 3 shows a cross-section of the device 200 of FIG. 2 after application of an encapsulant 301 over the dies 202. Then, flow proceeds to block 103 of FIG. 1, in which the tape is cured such that the tape becomes non-adhesive, or has reduced adhesion, and the dies are released from the carrier plate. Curing the tape may comprise application of heat; the amount of heat required to cure the tape is dependent on the type of tape that is used. FIG. 4 shows the device 300 of FIG. 3 after curing of tape 203 and removal of carrier plate 201 and tape 203, leaving the dies 202 and the encapsulant 301. The device 400 of FIG. 4 is turned over with respect to the device 300 of FIG. 3, such that the surfaces of the dies 202 and their associated metallic interconnect pads are exposed for further processing according to method 100 of FIG. 1.

Figure 5:
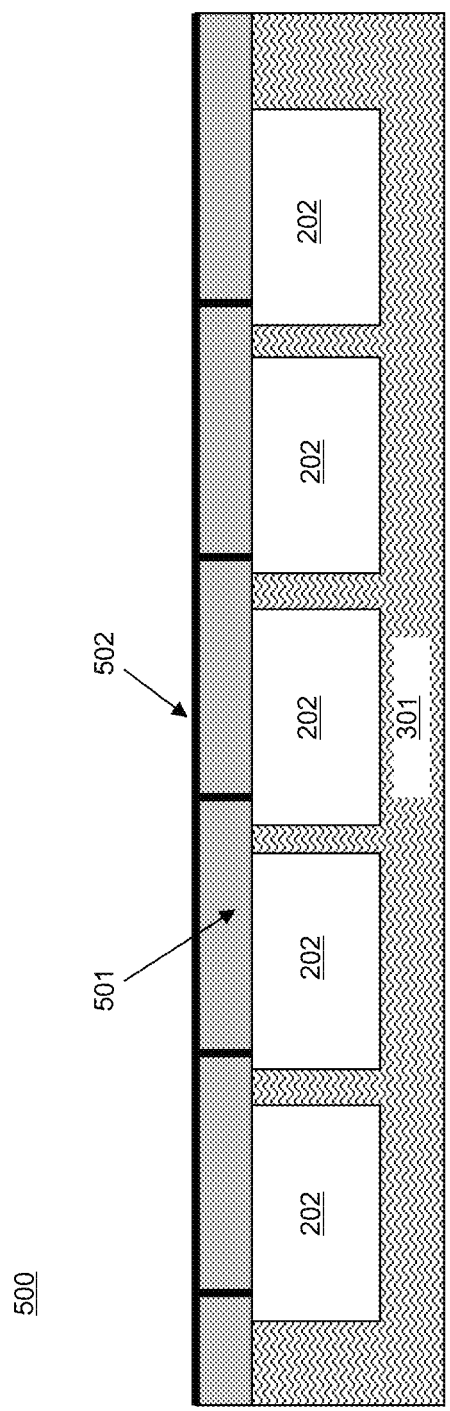

Turning again to FIG. 1, in block 104 of method 100, interconnect layers are formed over the dies to electrically interconnect the dies using semiconductor processing techniques. In some embodiments, three interconnect layers may be formed sequentially in block 104: a power plane, signal routing, and a ground plane. First, a layer of a receiver dielectric is applied to the exposed die surfaces. The layer of receiver dielectric may comprise any appropriate receiver dielectric material, and may be applied by spin coating, spray coating, or any other suitable process in various embodiments. The receiver dielectric is then etched to open vias to the underlying dies, and a conductive metal, such as copper, is deposited over the etched receiver dielectric to form a first interconnect layer. This first interconnect layer may comprise the power plane. FIG. 5 shows the device 400 of FIG. 4 after application of receiver dielectric 501 to the exposed surfaces of dies 202, etching of receiver dielectric 501, and deposition of conductive metal to form first interconnect layer 502, which electrically connects the dies 202. The first interconnect layer may have any appropriate configuration; first interconnect layer 502 of FIG. 5 is shown for illustrative purposes only. Then, after formation of the first interconnect layer, a second interconnect layer is formed over the receiver dielectric and first interconnect layer. Additional receiver dielectric material is first applied over the receiver dielectric and the first interconnect layer. This additional receiver dielectric material may also be applied by spin coating, spray coating, or any other suitable process in various embodiments. The receiver dielectric is then etched to open vias to the underlying dies 202 and the first interconnect layer 502 (if desired), and additional conductive metal is deposited over the etched receiver dielectric to form the second interconnect layer, which electrically connects the dies 202. The second interconnect layer may comprise signal routing.

Figure 6:
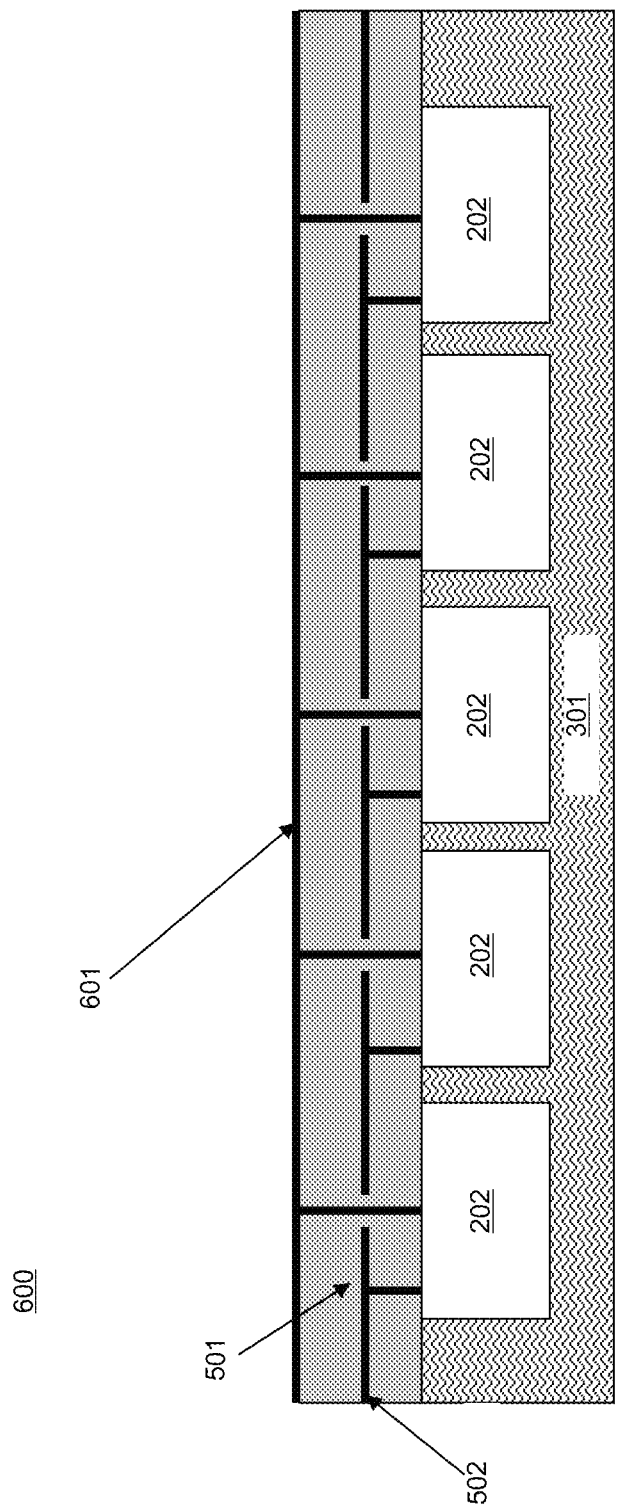
Figure 7:
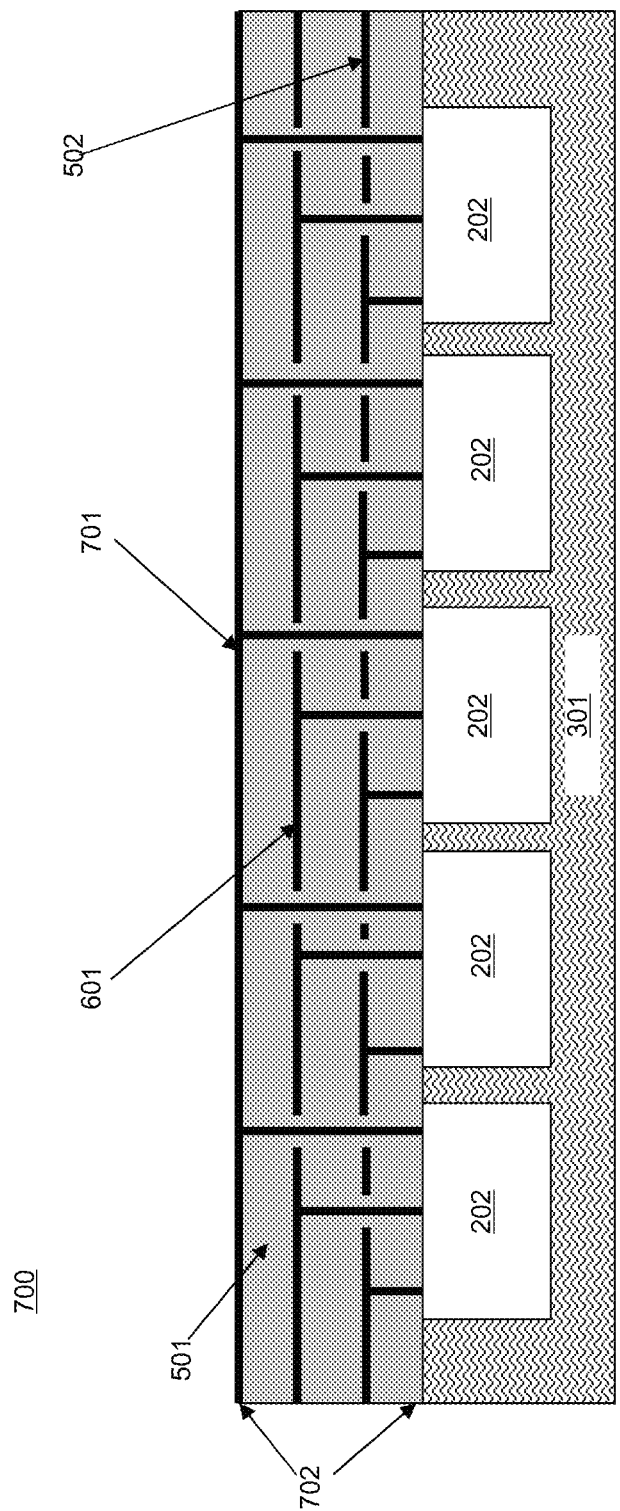

FIG. 6 shows the device 500 of FIG. 5 after application of additional receiver dielectric 501 over the first interconnect layer 502, etching of the receiver dielectric 501, and deposition of conductive metal to form second interconnect layer 601. The second interconnect layer may have any appropriate configuration, the second interconnect layer 601 of FIG. 6 is shown for illustrative purposes only. Then, after formation of the second interconnect layer, a third interconnect layer is formed over the first and second interconnect layers. Additional receiver dielectric material is first applied over the first and second interconnect layers. This additional receiver dielectric material may also be applied by spin coating, spray coating, or any other suitable process in various embodiments. The receiver dielectric is then etched to open vias to the underlying dies and the interconnect layers 502 and 601 (if desired), and additional conductive metal is deposited over the etched receiver dielectric to form the third interconnect layer. The third interconnect layer may comprise the ground plane. FIG. 7 shows the device 600 of FIG. 6 after application of additional receiver dielectric 501, etching of the receiver dielectric 501, and deposition of conductive metal to form third interconnect layer 701. The third interconnect layer may have any appropriate configuration, the third interconnect layer 701 of FIG. 7 is shown for illustrative purposes only. The receiver dielectric 501, first interconnect layer 502, second interconnect layer 601, and third interconnect layer 701 together make up die interconnection layer 702. Die interconnection layer 702 reduces the need for wire bonding between the dies 202 in the receiver chip, thereby reducing total imaging array size in the completed imaging system, while the ground and power planes provide low impedance ground and power distribution to the dies 202. The three interconnect layers 502, 601, and 701 that make up die interconnection layer 702 are shown for illustrative purposes only, various embodiments may include a die interconnection layer having any appropriate number and configuration of interconnect layers. Metal contacts (not shown) that are used for connections at the chip level (for example, clock, power, and ground inputs, and signal outputs) may also formed in the uppermost interconnect layer (for example, third interconnect layer 701).

Figure 8:
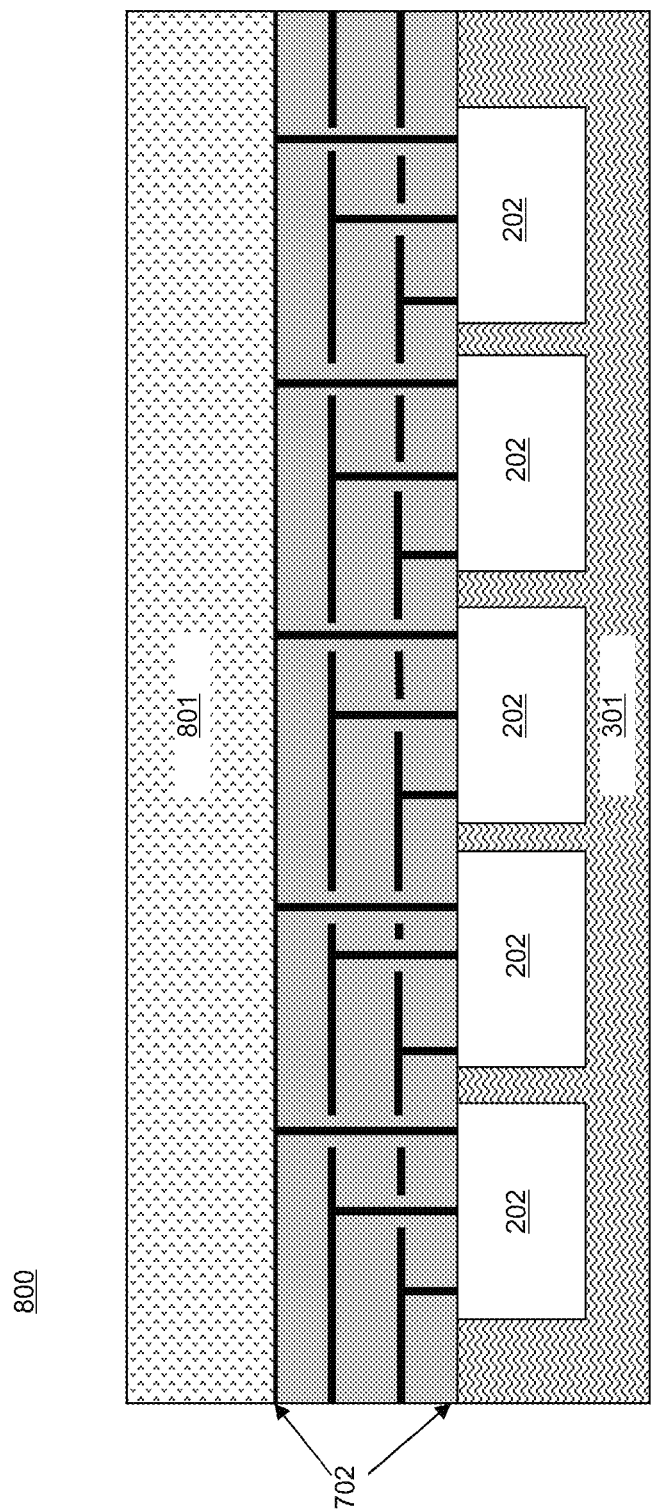
Figure 9:
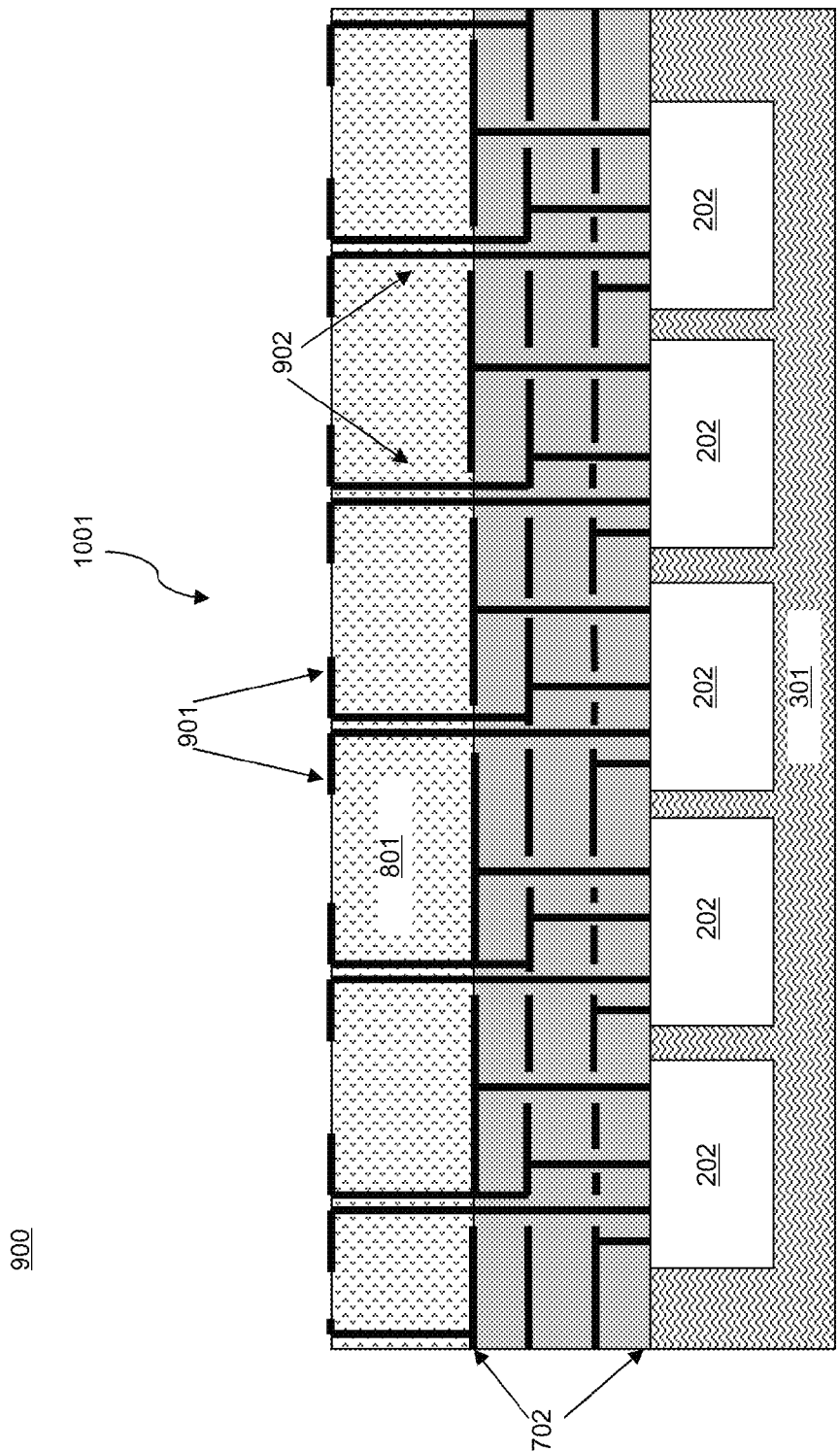

After formation of the die interconnection layer in block 104, flow of method 100 of FIG. 1 proceeds to block 105, in which a quarter wave dielectric layer is formed over the die interconnection layer. The thickness of the quarter wave dielectric layer is selected such that the quarter wave dielectric layer has a quarter wave thickness with respect to the frequency of the imaging system that is being fabricated based on the dielectric constant of the dielectric material that makes up the quarter wave dielectric layer. Therefore, the thickness of the quarter wave dielectric layer is selected based on the frequency of the imaging system and the material of the quarter wave dielectric layer. For example, in embodiments in which the imaging system senses energy in a frequency band from about 30 gigahertz (GHz) to over 1 terahertz (THz), the thickness of the quarter wave dielectric layer is selected to correspond to a center wavelength of the frequency band. In some embodiments, the quarter wave dielectric layer may comprise a polyimide tape such as Kapton®, a photoresist such as SU-8, a polystyrene such as Rexolite®, or a fluoride resin such as polytetrafluoroethylene (PTFE), and may have a thickness of about 400 micrometers ($\mu m$). The pixel antennae will be formed on top of the quarter wave dielectric layer (discussed below with respect to block 106 of FIG. 1); the selection of the thickness of the quarter wave dielectric layer allows relatively precise control of the distance between the antennae and the ground plane (i.e., the uppermost interconnect layer) in the die interconnection layer. FIG. 8 shows the device 700 of FIG. 7 after application of a quarter wave dielectric layer 801 over the die interconnection layer 702.

Figure 10:
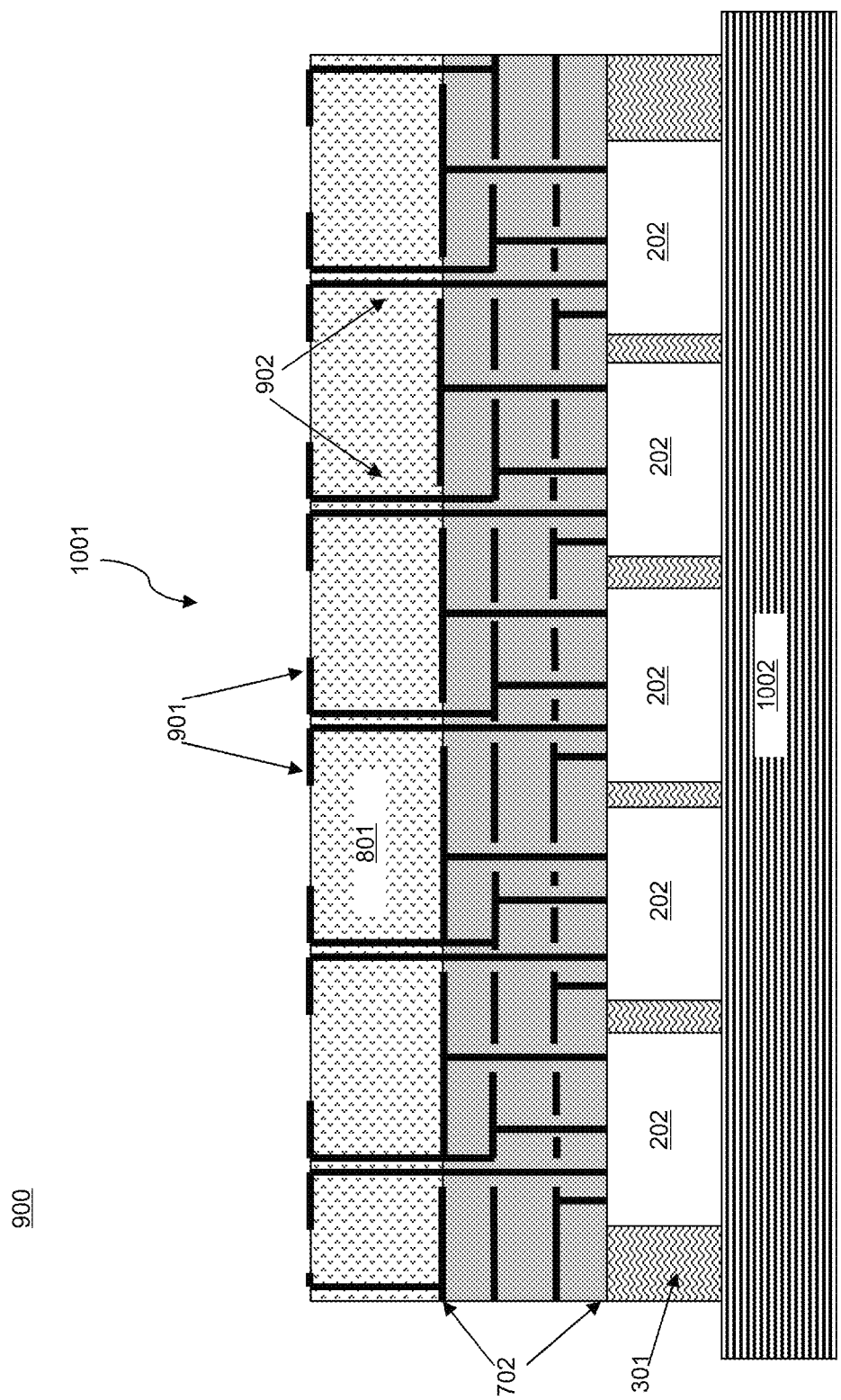

Returning again to FIG. 1, flow then proceeds to block 106, in which vias are formed through the quarter wave dielectric layer and the die interconnection layer to the dies, and respective antennae (and, in some embodiments, matching structures) corresponding to each individual receiver circuit in the dies are formed on the surface of the quarter wave dielectric layer. The antennae are electrically connected to the receiver circuits on the receiver dies by the vias. As discussed above, the selection of the thickness of the quarter wave dielectric layer determines the distance between the antennae and the ground plane (i.e., the uppermost interconnect layer); a relatively short distance between the antennae and the ground plane reduces signal loss in the imaging system. Metal contacts (not shown) that are used for connections at the chip level (for example, clock, power, and ground inputs, and signal outputs) may also formed in block 106, in addition to matching structures (not shown) on the surface of each antennae to compensate for differing impedances between antennae and the amplifiers (discussed in further detail below with respect to FIGS. 11A-B) that are used for signal processing in conjunction with the antennae. The vias may be formed by etching of the quarter wave dielectric layer and receiver dielectric, followed by deposition of a conductive metal such as copper. The antennae may also be formed by deposition of a conductive metal such as copper. FIG. 10 shows the device 900 of FIG. 9 after formation of antennae corresponding to dies 202, such as antenna 901, and vias such as vias 902. Vias 902 may contact the dies 202 directly, or may indirectly contact the dies 202 through any of the interconnect layers in die interconnection layer 702. Each antenna, such as antenna 901, corresponds to an individual receiver circuit contained within a receiver die of dies 202, and is located on top of the quarter wave dielectric layer 801. The vias and antennae may have any appropriate configuration; in FIG. 9, antenna 901 and vias 902 are shown for illustrative purposes only.

Returning to FIG. 1, in block 107 the encapsulant is thinned, the encapsulated dies are diced into groups of dies to form receiver chips, and a plurality of receiver chips are mounted on a thermal plate to form an imaging array. FIG. 10 shows a receiver chip 1001 comprising dies 202, die interconnection layer 702, quarter wave dielectric layer 801, antenna 901, and vias 902, after thinning of encapsulant 301, dicing to separate the receiver chip 1001 from any adjacent chips (not shown), and mounting on a thermal plate 1002. The thermal plate 1002 may comprise any material that is appropriate for dissipating heat from the receiver chip 1001, such as aluminum or copper. The receiver chip 1001 may be connected via metal contacts on the receiver chip 1001 to other receiver chips, as needed, that are also mounted on the plate 1002 to form a an imaging array of a desired size. A thermal plate, such as thermal plate 1002, may have any appropriate number of receiver chips, such as receiver chip 1001, mounted thereon. The receiver chip comprises the plurality of encapsulated dies 202, which in some embodiments may comprise a plurality of silicon or silicon germanium receiver dies, and in other embodiments may comprise a mixture of indium phosphide or gallium arsenide receiver dies and silicon or silicon germanium baseband logic dies. Lastly, flow of method 100 of FIG. 1 proceeds to block 108, in which chip to system connections and any necessary system connections are formed in conjunction with the receiver chips on the thermal plate to form an imaging array having a desired size. Any number receiver circuits may be included in receiver chip 1001, and any number of receiver chips such as receiver chip 1001 may be connected together to form an imaging array.

Figure 11A:
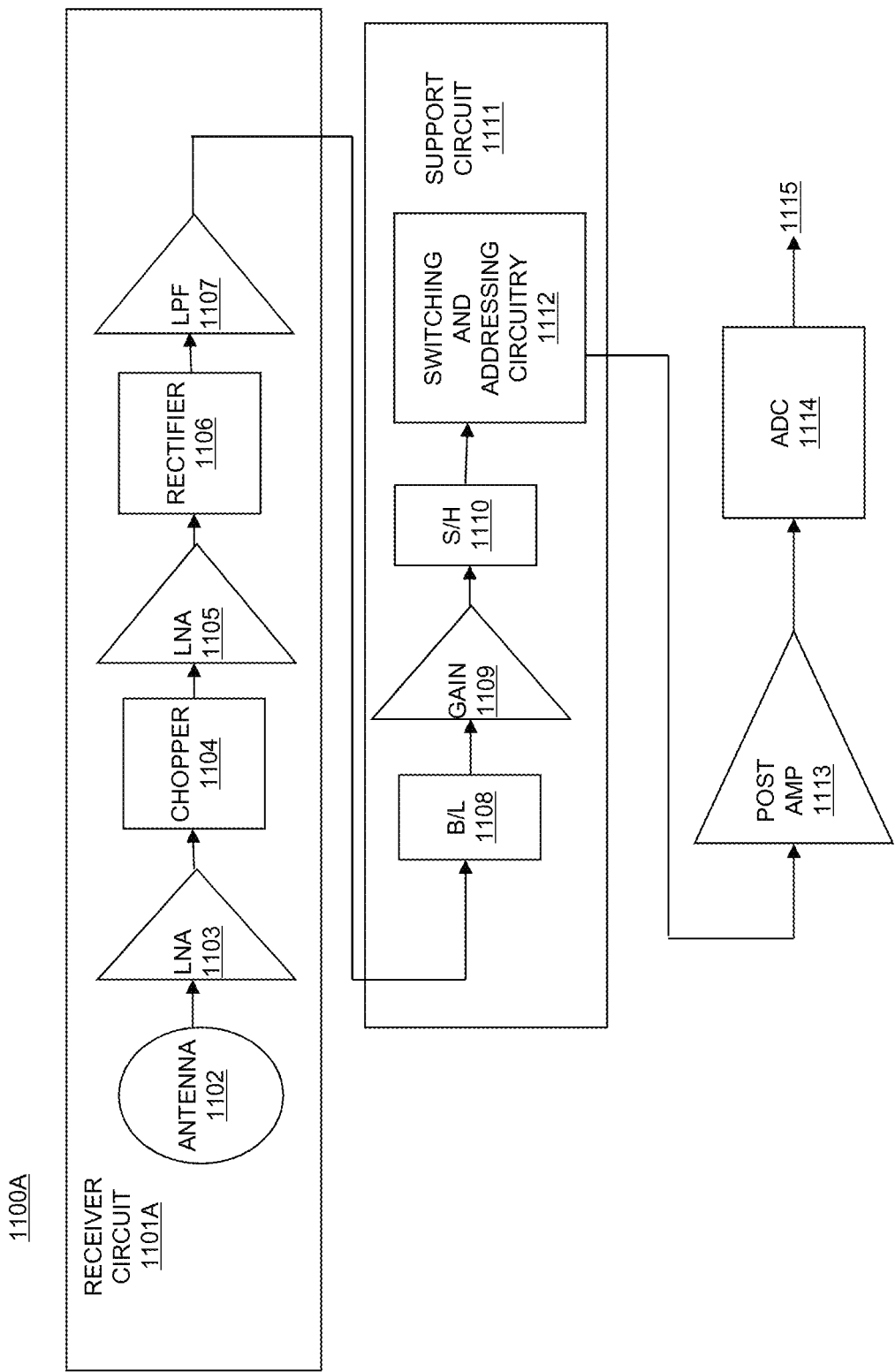
FIGS. 11A-B are schematic diagrams of exemplary embodiments of receiver circuits.
Figure 11B:
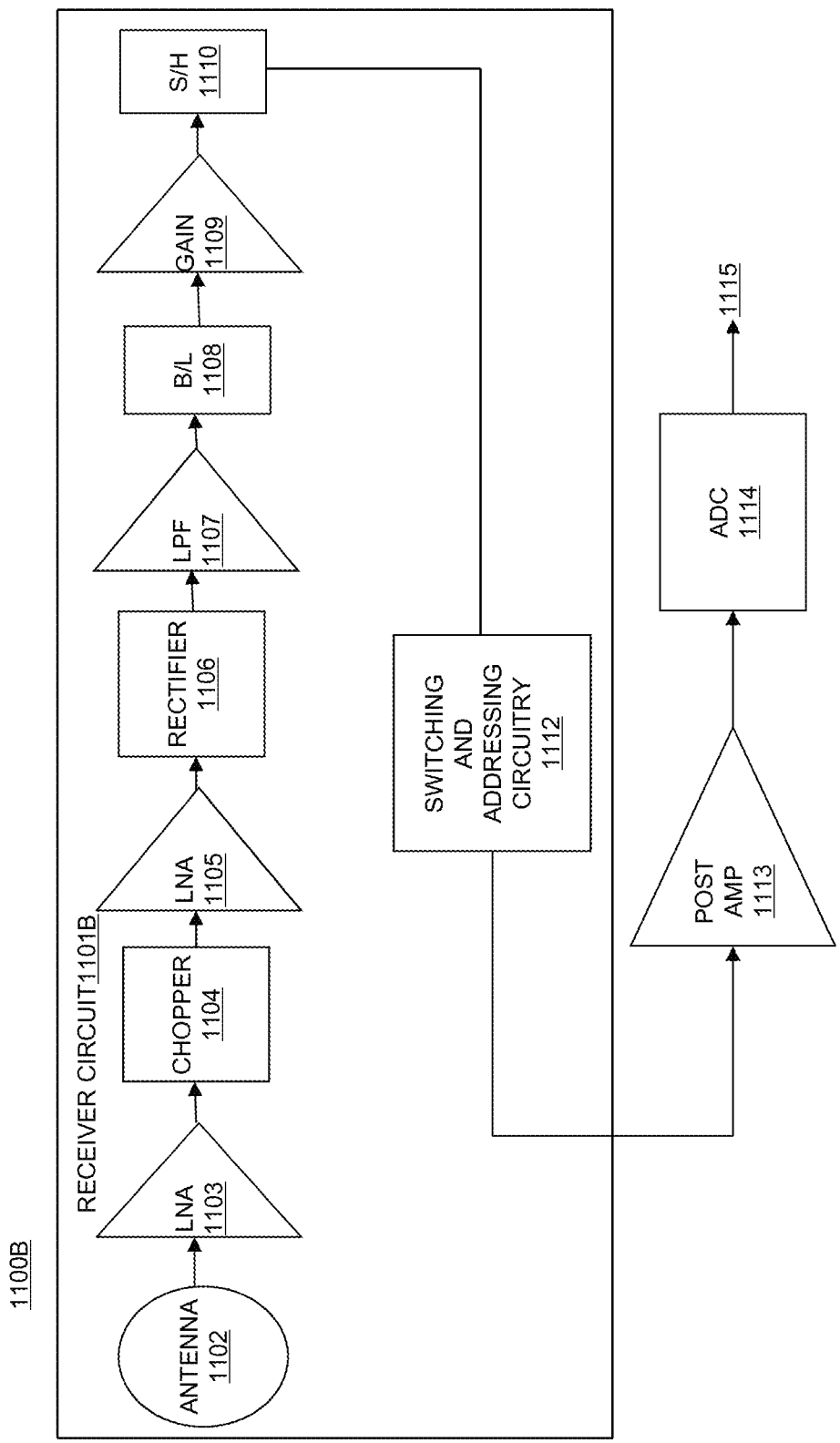

FIGS. 11A-B shows schematic diagrams of various embodiments of a receiver circuits. FIG. 11A corresponds to an embodiment in which the receiver dies comprise gallium arsenide or indium phosphide, and the dies 202 comprise a mix of receiver dies and baseband logic dies. In such an embodiment, the dies 202, including the receiver dies and baseband logic dies, are connected and encapsulated together to form a receiver chip such as receiver chip 1001 of FIG. 10. FIG. 11B corresponds to an embodiment in which the dies 202 comprise silicon or silicon germanium, and each of the dies 202 comprises a receiver die. Turning to FIG. 11A, In system 1100A, receiver circuit 1101A includes a respective antenna 1102, which corresponds to an antenna 901 such as was shown in FIGS. 9-10 and is associated with a single receiver circuit located in a receiver chip 1001. The signal output of antenna 1102 is fed through signal processing elements including a low-noise amplifier (LNA) 1103, chopper 1104, LNA 1105, rectifier 1106, and low pass filter 1107.

Chopper 1104 may comprise a dickie chopper in some embodiments. In some embodiments, the antenna 1102 may also include a matching structure (not shown) on the antenna surface to compensate for differing impedances between the antenna 1102 and the LNAs 1103 and 1105. Support circuit 1111 receives the output of low pass filter 1107 in receiver circuit 1101, and includes bandwidth limiting (B/L) 1108, gain 1109, and sample/hold (S/H) 1110. Each receiver circuit 1101B in a receiver chip has respective support circuit 1111. In embodiments of a receiver chip corresponding to FIG. 11A, the support circuit 1111 is located on a baseband logic die, comprising a baseband logic die, that is integrated into receiver chip 1001. In such an embodiment, a receiver die of dies 202 may include any appropriate number of receiver circuits 1101A, and an associated baseband logic die may include any appropriate number of associated support circuits 1111. The number of receiver circuits 1101A on a receiver die may be different from the number of support circuits 1111 in a baseband logic die in some embodiments. In various embodiments, receiver circuits 1101A on the same receiver die may be associated with respective support circuits 1111 that are located on different baseband logic dies, and/or support circuits 1111 that are located on the same baseband logic die may be associated with respective receiver circuits 1101A that are located on different receiver dies. Switching and addressing circuitry 1112 also included in the support circuit 1111, and receives the output of S/H 1110. The switching and addressing circuitry 1112, in conjunction with switching and addressing circuitry in other support circuits in the receiver chip, provides signal outputs of a plurality of receiver/support circuits in the receiver chip to downstream signal processing circuitry including post-amplifier 1113 and an analog-to-digital converter (ADC) 1114. ADC 1114 outputs a low voltage differential signal (LVDS) signal at signal output 1115. The switching and addressing circuitry 1112 are discussed in further detail below with respect to FIGS. 12-14.

In system 1100B of FIG. 11B, the receiver dies comprise silicon or silicon germanium, and no baseband logic dies are necessary. In FIG. 1B, the elements that were included in support circuit 1111 as was shown in FIG. 11A, and the switching and addressing circuitry 1112, are integrated into the receiver circuits 1101B on the receiver dies, and all of the dies 202 comprise receiver dies. The receiver circuit 1101B includes a respective antenna 1102, which corresponds to an antenna 901 such as was shown in FIGS. 9-10 and is associated with a single receiver circuit located in a receiver chip 1001. The signal output of antenna 1102 is fed through signal processing elements including a LNA 1103, chopper 1104, LNA 1105, rectifier 1106, low pass filter 1107, B/L 1108, gain 1109, and S/H 1110. Chopper 1104 may comprise a dickie chopper in some embodiments. In some embodiments, the antenna 1102 may also include a matching structure (not shown) on the antenna surface to compensate for differing impedances between the antenna 1102 and the LNAs 1103 and 1105. In embodiments corresponding to FIG. 11B, dies 202 may include any appropriate number of receiver circuits 1101B. Switching and addressing circuitry 1112 is also included in receiver circuit 1101B, and receives the output of S/H 1110. The switching and addressing circuitry 1112, in conjunction with switching and addressing circuitry in other receiver circuits in the receiver chip, provides signal outputs of a plurality of receiver circuits to downstream signal processing circuitry including post-amplifier 1113 and an analog-to-digital converter (ADC) 1114. ADC 1114 outputs a low voltage differential signal (LVDS) signal at signal output 1115. The switching and addressing circuitry 1112 and associated signal processing circuitry are discussed in further detail below with respect to FIGS. 12-13.

Figure 12:
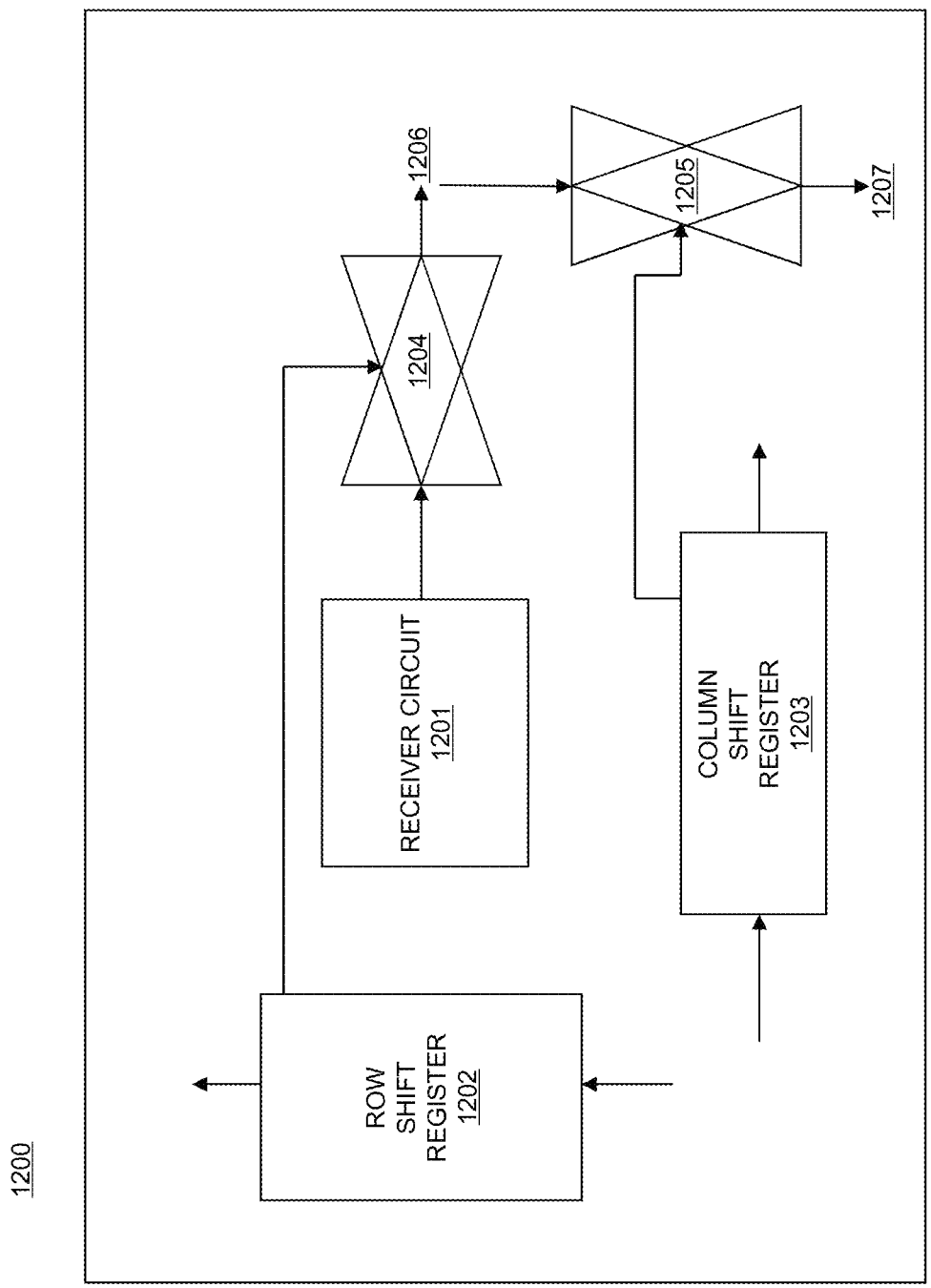
FIG. 12 is a schematic diagram of an exemplary embodiment of switching and addressing circuitry for a receiver circuit.

FIG. 12 shows a pixel unit 1200 including switching and addressing circuitry for a receiver circuit, which may comprise switching and addressing circuitry 1112 of FIG. 11A-B. Receiver circuit 1201 may include the signal processing elements 1102-1110 as were shown in FIGS. 11A-B. The signal output of receiver circuit 1201 (i.e., the output of S/H 1110 as shown in FIGS. 11A-B) is supplied via switch 1204 to output 1206. In some embodiments, output 1206 of all elements contained within a single column of a receiver chip may be tied together through a column bus formed in one of the interconnecting layers. At the top or bottom of the receiver chip, the column bus is connected to input of switch 1205, with the output of each column's switch 1205 being connected to a row bus formed in one of the interconnecting layers. The switch 1204 is opened and closed by a row shift register (RSR) 1202, and the switch 1205 is opened and closed by a column shift register (CSR) 1203. Shift registers 1202 and 1203 are shown for exemplary purposes only; other addressing schemes such as gray code counters may be used in various embodiments. RSR 1202 may be cascaded with other RSRs associated with adjacent receiver circuits in the same row of a pixel array, and CSR 1203 may also be cascaded with other CSRs associated with adjacent receiver circuits in the same column of the pixel array. The receiver circuit outputs may also be cascaded across different receiver dies, and, in some embodiments, different receiver chips. While RSRs and CSRs are shown in the pixel unit 1200 of FIG. 12, in some embodiments, row counters and column counters may be used.

Figure 13:
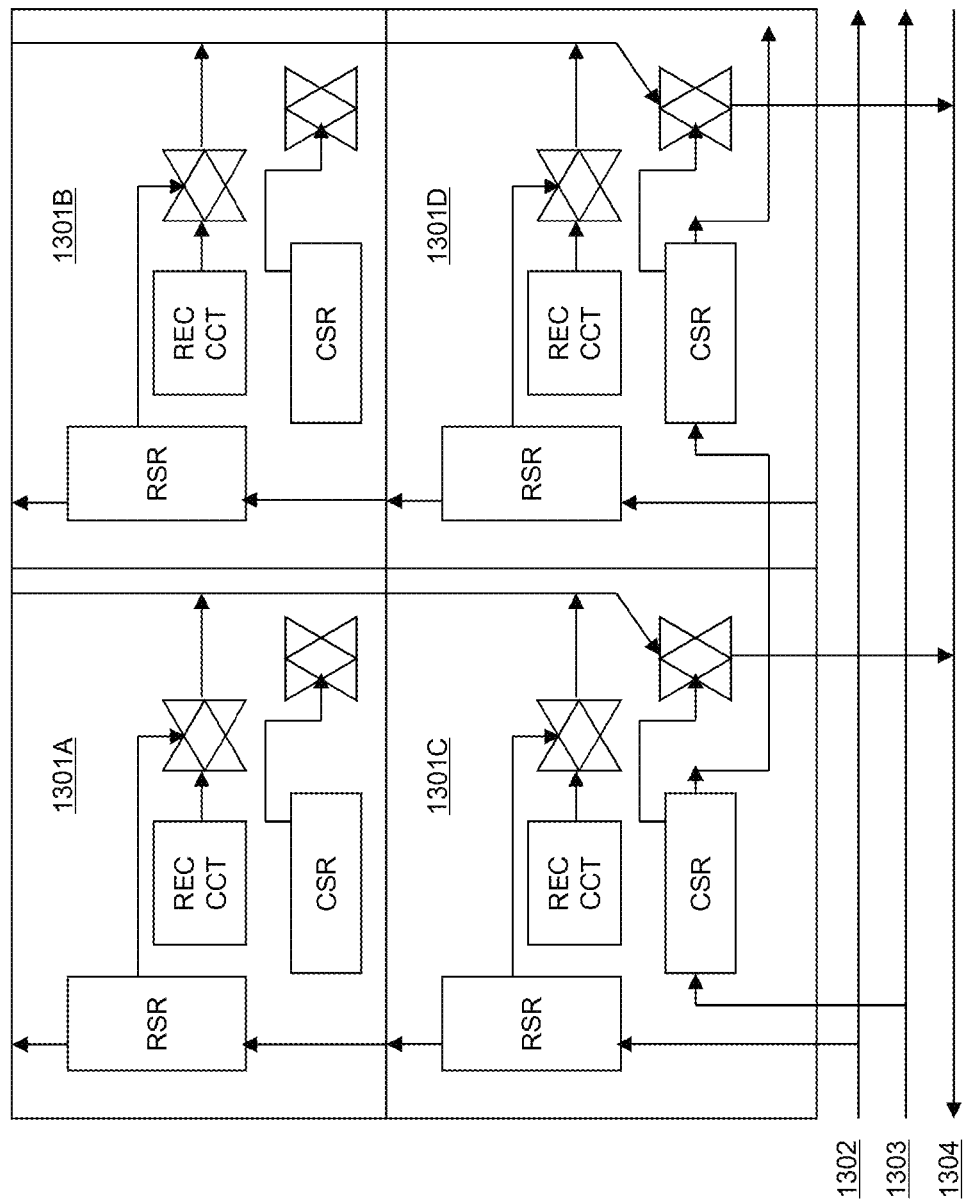
FIG. 13 is a schematic diagram of an exemplary embodiment of interconnected receiver circuit switching and addressing circuitry.

Interconnections between RSRs and CSRs in a pixel array is shown in FIG. 13, which shows a schematic block diagram of an example 2 by 2 pixel array 1300, including pixel units 1301A-D, each of which include the elements shown with respect to pixel units 1200 of FIG. 12. Each of pixel units 1301A-D includes a respective RSR, CSR, switches, and receiver circuit. The pixel array 1300 also has a row clock input 1302, which controls the RSRs, a column clock input 1303, which controls the CSRs, and a signal output 1304, which is connected to a signal input of post-amplifier 1113. Only the CSRs and associated switches in the pixel units 1301C-D in the bottom row of the pixel array 1300 are connected to the column clock input 1303 and the signal output 1304; these CSRs select the current column. The CSRs and associated switches of pixel units 1301A-B are not connected to other elements in the pixel array 1300, and may be omitted. Each of the RSRs and associated switches in the pixel units 1301A-D are connected to the row clock input 1302 and the signal output 1304. The various switches are turned off and on as controlled by the row clock input 1302 and the column clock input 1303 to provide signal outputs from the each of the receiver circuits in pixel units 1301A-D in turn to the signal output 1304. This allows individual addressing by row and column of the signal outputs of the various receiver circuits in pixel units 1301A-D. The switching and addressing logic, including the switches and RSRs and CSRs as discussed with respect to FIGS. 12 and 13, may be included in the receiver circuits on the receiver dies with the receiver chip in embodiments in which the receiver dies comprise silicon or silicon germanium, or in the support circuits on separate baseband logic dies that are integrated into the receiver chip with the receiver dies in embodiments in which the receiver dies comprise gallium arsenide or indium phosphide. While RSRs and CSRs are shown in the pixel array 1300 of FIG. 13, in some embodiments, row counters and column counters may be used.

Figure 14:
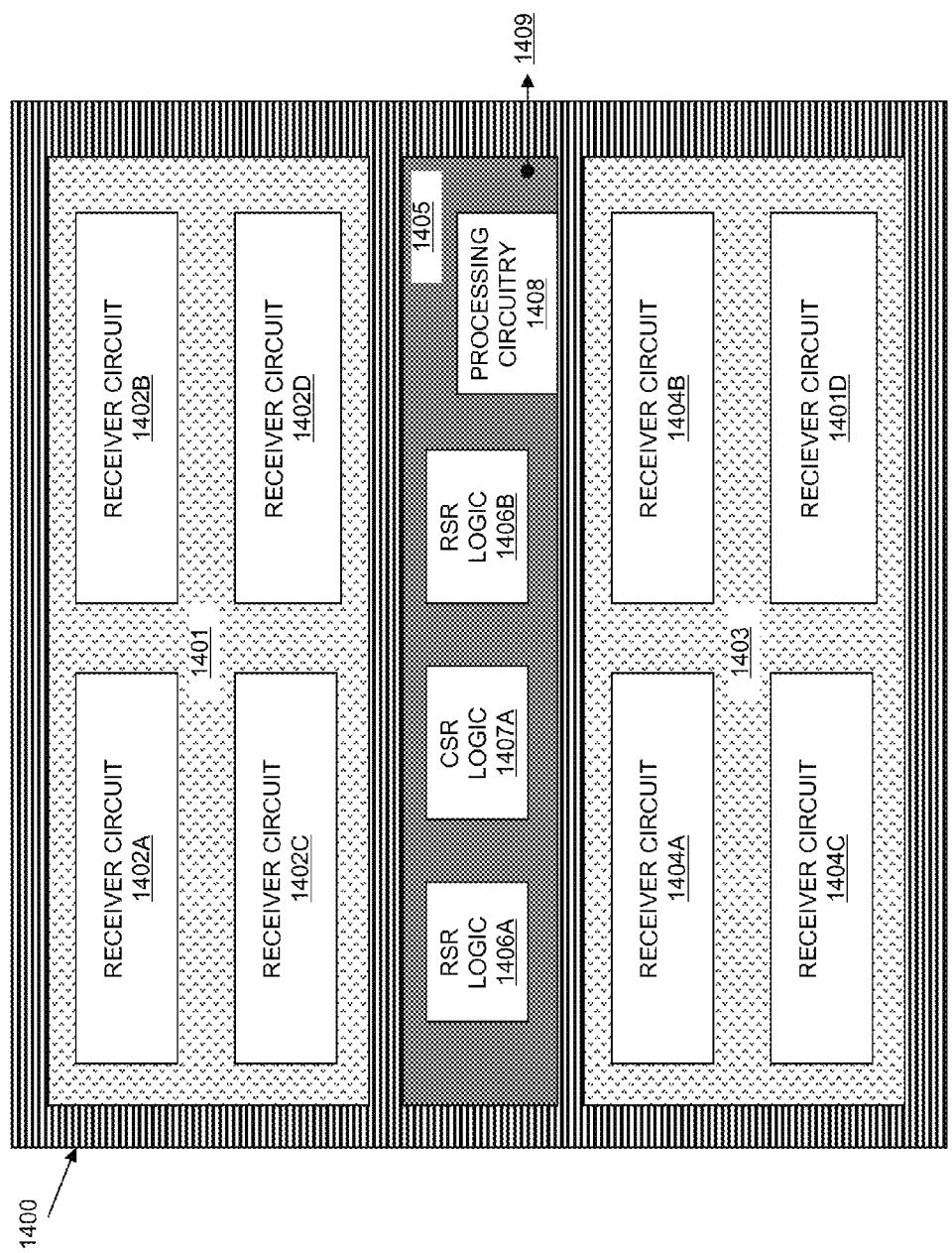
FIG. 14 is a schematic diagram of an exemplary embodiment of a heterogeneous package for an imaging system.

FIG. 14 shows an example heterogeneous implementation of an imaging array corresponding to the embodiments of a receiver chip that was discussed with respect to FIG. 11A, in which the receiver dies comprise gallium arsenide or indium phosphide. Receiver dies 1401 and 1402 and baseband logic die 1405 are mounted on a plate 1400. Plate 1400 may correspond to a plate such as thermal plate 1002 as was described with respect to FIG. 10. Any appropriate number of additional receiver and baseband logic dies (not shown) may also be mounted on plate 1400 and connected to receiver dies 1401 and 1402 and baseband logic die 1405 to form a receiver chip such as receiver chip 1001 of FIG. 10. The baseband logic die 1405 may comprise silicon or silicon germanium in various embodiments. Each of receiver circuits 1402A-D and 1404A-D on receiver dies 1401 and 1403 includes a single antenna, and further includes the signal processing elements 1102-1107 described with respect to FIG. 11A. Baseband logic die 1405 includes switching and addressing circuitry, such as switching and addressing circuitry 1112 of FIGS. 11A-B, including RSR logic 1406A-B and CSR logic 1407, such as was described with respect to FIGS. 12-13. Support circuitry 1408 includes support circuits for each of the receiver circuits 1402A-D and 1404A-D, which may include signal processing elements 1108-1110 of support circuit 1111 as was shown in FIG. 11A. The outputs of receiver circuits 1402A-D and 1404A-D are addressed to the column bus by the RSR logic 1406A-B and to the row bus by CSR logic 1407. CSR logic may select between a first column including receiver circuits 1402A, 1402C, 1404A and 1404C and a second column including receiver circuits 1402B, 1402D, 1404B and 1404D, while RSR logic 1406A steps through the receiver circuits 1402A, 1402C, 1404A and 1404C in the first column, and RSR logic 1406B steps through the receiver circuits 1402B, 1402D, 1404B and 1404D in the second column, such that the output of each receiver circuit is provided in turn to the signal output 1409, which may be connected to a post-amplifier 1113 as was shown in FIG. 11A. While RSRs and CSRs are shown in FIG. 14, in some embodiments, row counters and column counters may be used.

FIGS. 15A-B show an example multichip packaging system for an imaging array system. FIG. 15A shows a imaging array 1500A including a receiver chip 1502, which may comprise a 16 column by 64 row pixel array in some embodiments, with bias area 1501 and postamplification/ADC logic area 1503. The approximate size of an exemplary receiver chip 1502, which includes receiver chip formed by method 100 of FIG. 1 and including receiver dies (and, in some embodiments, baseband logic dies) comprising receiver circuits such as are described with respect to FIG. 11A or 11B, may be about 128 mm by about 32 mm in some embodiments. The bias area 1501 allows space for connections between imaging array 1500A and other imaging arrays to form a larger imaging array system 1500B such as is shown in FIG. 15B. Imaging arrays 1504A-D in FIG. 15B each include respective receiver chips 1502, bias areas 1501, and postamplification/ADC logic area 1503 such as are shown in imaging array 1500A of FIG. 15A. Imaging arrays 1504A-D are connected to an image processing field programmable gate array (FPGA) 1505 that outputs a composite image based on the signal outputs from each of the receiver circuits in the receiver chips 1502. Timing (i.e., clock) signals, such as the row and column clocks discussed above with respect to FIG. 13, are provided from the image processing FPGA 1505 to the imaging arrays 1504A-D.

While the disclosure has been described with reference to a preferred embodiment or embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular embodiment disclosed as the best mode contemplated for carrying out this disclosure, but that the disclosure will include all embodiments falling within the scope of the appended claims.

What is claimed is:

1. A receiver chip for use in an imaging system, comprising:
   a plurality of receiver dies, each of the receiver dies comprising one or more receiver circuits;
   a die interconnection layer located on top of the plurality of receiver dies;
   a quarter wave dielectric layer located on top of the die interconnection layer; and
   a plurality of antennae located on the quarter wave dielectric layer, each of the plurality of antennae corresponding to a respective receiver circuit, wherein the plurality of antennae are connected to the one or more receiver circuits through the quarter wave dielectric layer and the die interconnection layer by respective vias, such that a distance between a topmost layer of the die interconnection layer and the plurality of antennae is determined by a thickness of the quarter wave dielectric layer.

2. The receiver chip of claim 1, wherein the die interconnection layer comprises a plurality of conducting layers comprising ground, interconnect and power planes each separated by a dielectric layer.

3. The receiver chip of claim 1, wherein the receiver dies comprise silicon or silicon germanium, and wherein the one or more receiver circuits each comprise a low noise amplifier, a chopper, a rectifier, a low pass filter, bandwidth limiting, gain, and a sample and hold stage.

4. The receiver chip of claim 3, wherein the receiver circuits further comprise addressing logic configured to address the respective signal outputs of the one or more receiver circuits on the plurality of receiver dies via a plurality of switches.

5. The receiver chip of claim 4, wherein the addressing logic comprises at least one row shift register and at least one column shift register configured to address the respective signal outputs of the one or more receiver circuits via the plurality of switches.

6. The receiver chip of claim 4, wherein the addressing logic comprises at least one row counter and at least one column counter configured to address the respective signal outputs of the receiver circuits via the plurality of switches.

7. The receiver chip of claim 4, wherein the addressing logic is configured to cascade the signal inputs or outputs of the one or more receiver circuits between the plurality of receiver dies.

8. The receiver chip of claim 1, wherein the receiver dies comprise gallium arsenide or indium phosphide, and wherein the one or more receiver circuits each comprise a low noise amplifier, a chopper, a rectifier, and a low pass filter.

9. The receiver chip of claim 8, further comprising a plurality of support circuits, each support circuit being associated with a respective receiver circuit, wherein the plurality of support circuits are located on a baseband logic die that is located in the receiver chip and connected to the die interconnection layer, the baseband logic die comprising silicon or silicon germanium, each support circuit comprising bandwidth limiting, gain, and a sample and hold stage.

10. The receiver chip of claim 9, wherein the support circuits further comprise addressing logic configured to address the respective signal outputs of the one or more receiver circuits on the plurality of receiver dies via a plurality of switches.

11. The receiver chip of claim 10, wherein the addressing logic comprises at least one row shift register and at least one column shift register configured to address the respective signal outputs of the one or more receiver circuits via the plurality of switches.

12. The receiver chip of claim 10, wherein the addressing logic comprises at least one row counter and at least one column counter configured to address the respective signal outputs of the receiver circuits via the plurality of switches.

13. The receiver chip of claim 10, wherein the addressing logic is configured to cascade the signal inputs or outputs of the one or more receiver circuits between the plurality of receiver dies.

14. The receiver chip of claim 1, further comprising a plurality of matching structures, each of the plurality of matching structures corresponding to a respective one of the one or more receiver circuits and antennae, wherein each matching structure is configured to compensate for differing impedances between the matching structure's respective antenna and a low noise amplifier input of the receiver circuit.

15. The receiver chip of claim 1, wherein the quarter wave dielectric layer has a thickness corresponding to a quarter wave thickness with respect to a frequency of the imaging system based on a dielectric constant of a material that comprises the quarter wave dielectric layer.

16. The receiver chip of claim 15, wherein the quarter wave dielectric layer comprises one of photoresist, polyimide, fluoride resin, and polystyrene.

17. The receiver chip of claim 1, wherein the antennae sense energy in a frequency band of interest that is from about 30 gigahertz (GHz) to over 1 terahertz (THz), and wherein a thickness of the quarter wave dielectric layer corresponds to a center wavelength of the frequency band of interest.

18. The receiver chip of claim 1, wherein the receiver chip is mounted on a thermal plate.

19. A receiver chip for use in an imaging system, comprising:
  a plurality of receiver dies, each of the receiver dies comprising one or more receiver circuits;
  a plurality of baseband logic dies, the plurality of baseband logic dies each comprising one or more support circuits, each support circuit being associated with a respective receiver circuit; and
  a die interconnection layer located on top of and connected to the plurality of receiver dies and baseband logic dies, the die interconnection layer comprising a plurality of conducting layers comprising ground, interconnect and power planes each separated by a dielectric layer, wherein the plurality of baseband logic dies comprise silicon or silicon germanium, and wherein the plurality of receiver dies comprise gallium arsenide or indium phosphide.

20. The receiver chip of claim 19, further comprising:
  a quarter wave dielectric layer located on top of the die interconnection layer; and
  a plurality of antennae located on the quarter wave dielectric layer, each of the plurality of antennae corresponding to a respective receiver circuit, wherein the plurality of antennae are connected to the one or more receiver circuits through the quarter wave dielectric layer and the die interconnection layer by respective vias, such that a distance between a topmost layer of the die interconnection layer and the plurality of antennae is determined by a thickness of the quarter wave dielectric layer.

* * * * *